US011557488B2

United States Patent
Tanno

(10) Patent No.: US 11,557,488 B2
(45) Date of Patent: Jan. 17, 2023

(54) GETTERING PROPERTY EVALUATION APPARATUS

(71) Applicant: DISCO CORPORATION, Tokyo (JP)

(72) Inventor: Yasushi Tanno, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 322 days.

(21) Appl. No.: 16/953,538

(22) Filed: Nov. 20, 2020

(65) Prior Publication Data

US 2021/0175131 A1 Jun. 10, 2021

(30) Foreign Application Priority Data

Dec. 6, 2019 (JP) .............................. JP2019-221521

(51) Int. Cl.
*H01L 21/322* (2006.01)
*H01L 21/66* (2006.01)
(Continued)

(52) U.S. Cl.
CPC .......... *H01L 21/3221* (2013.01); *B24B 7/228* (2013.01); *G01R 31/2831* (2013.01); *H01L 22/12* (2013.01)

(58) Field of Classification Search
CPC . H01L 22/10; H01L 27/14698; H01L 31/186; H01L 22/12; H01L 21/3221; H01L 21/322; B24B 7/228; G01R 31/2831
See application file for complete search history.

(56) References Cited

U.S. PATENT DOCUMENTS 7,244,306 B2 * 7/2007 Kurita .................. C04B 24/003
117/14
8,736,832 B2 * 5/2014 Funada ............. G01N 21/9501
356/237.4

(Continued)

FOREIGN PATENT DOCUMENTS

JP   2016012594 A   1/2016
JP   2016012595 A   1/2016

OTHER PUBLICATIONS

Sio et al., Impact of Phosphorous Gettering and Hydrogenation on the Surface Recombination Velocity of Grain Boundaries in p-Type Multicrystalline Silicon, Sep. 2015, IEEE Journal of Photovoltaics, vol. 5, pp. 1357-1365 (Year: 2015).*

(Continued)

*Primary Examiner* — Eduardo A Rodela
(74) *Attorney, Agent, or Firm* — Greer Burns & Crain Ltd.

(57) ABSTRACT

A gettering property evaluation apparatus includes a gettering determination unit and a chuck table. The gettering determination unit has a laser beam applying unit for applying a laser beam to a wafer, and a transmission-reception unit for applying a microwave to the wafer and receiving the microwave reflected by the wafer. The gettering determination unit determines whether or not a gettering layer including a grinding strain generated by grinding the wafer has a gettering property. The chuck table holds the wafer on a holding surface. The chuck table has a conductive nonmetallic porous member constituting the holding surface and having a property of reflecting or absorbing the microwave, and a base member provided with a negative pressure transmission passage for transmitting a negative pressure to the nonmetallic porous member.

8 Claims, 11 Drawing Sheets

(51) Int. Cl.
*G01R 31/28* (2006.01)
*B24B 7/22* (2006.01)

(56) References Cited

U.S. PATENT DOCUMENTS

| | | | | |
|---|---|---|---|---|
| 8,912,799 | B2* | 12/2014 | Lagowski | G01R 31/2648 |
| | | | | 324/501 |
| 9,103,792 | B2* | 8/2015 | Trupke | G01N 21/9505 |
| 9,131,170 | B2* | 9/2015 | Mandelis | G01N 21/6489 |
| 9,679,820 | B2* | 6/2017 | Sukegawa | G01N 21/9501 |
| 9,685,906 | B2* | 6/2017 | Lagowski | H02S 50/15 |
| 10,157,802 | B2* | 12/2018 | Sukegawa | G01N 22/02 |
| 2015/0380283 | A1* | 12/2015 | Sukegawa | B24B 37/04 |
| | | | | 451/73 |

OTHER PUBLICATIONS

Fenning et al., Investigation of Lifetime-Limiting Defects After High-Temperature Phosphorus Diffusion in High-Iron-Content Multicrystalline Silicon, May 2014, IEEE Journal of Photovoltaics, vol. 4, pp. 866-873 (Year: 2015).*

* cited by examiner

GETTERING PROPERTY EVALUATION APPARATUS

BACKGROUND OF THE INVENTION

Field of the Invention

The present invention relates to a gettering property evaluation apparatus.

Description of the Related Art

In recent years, for making device chips smaller in size and weight, a wafer after formation of devices is processed to be thinner. However, when the wafer is polished to a thickness of 100 µm or below, gettering property for restrain movements of metallic elements harmful to the devices is lowered, and malfunction of the devices may be generated. To solve this problem, there has been proposed a method in which a gettering layer for capturing metallic elements is formed in a wafer, excited light and microwave are applied to the wafer to generate excessive carriers, and gettering performance (hereinafter referred to as gettering property) of the gettering layer is evaluated based on an attenuation time of the microwave reflected (see Japanese Patent Laid-Open No. 2016-012594 and Japanese Patent Laid-Open No. 2016-012595).

SUMMARY OF THE INVENTION

At the time of evaluating the gettering property of a wafer by the related method described above, the wafer as an object of evaluation of gettering property is held under suction on a holding surface of a chuck table configured by joining a member including a porous material such as alumina ceramic to a metallic base which includes a metal such as stainless steel and in which grooves serving as an exhaust flow path are carved. Here, the alumina ceramic has a property of transmitting microwaves, whereas the metal has a property of reflecting microwaves, so that when the wafer is held under suction by the chuck table and a microwave is applied to the wafer, the microwave is transmitted through the wafer and the porous material to be reflected by the metallic base. Since the metallic base is carved with grooves serving as an exhaust flow path and the transmission intensity of the microwave is attenuated in inverse proportion to the square of the transmission distance when the transmission distance is enlarged, according to Friis transmission formula, the intensity of the microwave reaching a receiver would be varied according to the ruggedness (projections and recesses) of the grooves serving as the exhaust flow path of the metallic base.

While no problem is generated in a case where evaluation of gettering property of a wafer is conducted at the same coordinates (or the same single point) every time, in a case where evaluation of gettering property of a wafer is conducted for the whole surface of the wafer or at a plurality of locations, the result of evaluation of gettering property would depend on the shape of the metallic base at each point, resulting in a problem that comparative evaluation is impossible.

Accordingly, it is an object of the present invention to provide a gettering property evaluation apparatus with which the influence of a chuck table holding under suction a wafer on the evaluation of gettering property is reduced.

In accordance with an aspect of the present invention, there is provided a gettering property evaluation apparatus including a gettering determination unit and a chuck table. The gettering determination unit has a laser beam applying unit for applying a laser beam to a wafer, and a transmission-reception unit for applying a microwave to the wafer and receiving the microwave reflected by the wafer. The gettering determination unit determines whether or not a gettering layer including a grinding strain generated by grinding the wafer has a gettering property. The chuck table holds the wafer on a holding surface. The chuck table has a conductive nonmetallic porous member constituting the holding surface and having a property of reflecting or absorbing the microwave, and a base member surrounding the nonmetallic porous member while exposing the holding surface and provided with a negative pressure transmission passage for transmitting a negative pressure to the nonmetallic porous member.

Preferably, the nonmetallic porous member includes a material having a total of reflectance of the microwave and absorbance of the microwave of equal to or more than 80%.

In addition, preferably, the nonmetallic porous member includes porous SiC or porous carbon.

In accordance with another aspect of the present invention, there is provided a gettering property evaluation apparatus including a gettering determination unit and chuck table. The gettering determination unit has a laser beam applying unit for applying a laser beam to a wafer, and a transmission-reception unit for applying a microwave to the wafer and receiving the microwave reflected by the wafer. The gettering determination unit determines whether or not a gettering layer including a grinding strain generated by grinding the wafer has a gettering property. The chuck table holds the wafer on a holding surface. The chuck table has a porous member constituting the holding surface and having a property of transmitting the microwave, a base member provided with a negative pressure transmission passage for transmitting a negative pressure to the porous member, a support member that is disposed on a lower side relative to the porous member to support the porous member, that is provided with a transmission passage for transmitting the negative pressure from the negative pressure transmission passage to the porous member, and that includes a material having a property of transmitting the microwave, and a reflective plate that is disposed on a lower side relative to the support member and that has a flat surface including a conductive material reflecting the microwave.

Preferably, the reflective plate includes one of stainless steel, iron, an iron-containing alloy, aluminum, an aluminum-containing alloy, copper, a copper-containing alloy, titanium, and carbon fiber reinforced plastic (CFRP).

In accordance with a further aspect of the present invention, there is provided a gettering property evaluation apparatus including a gettering determination unit and a chuck table. The gettering determination unit has a laser beam applying unit for applying a laser beam to a wafer, and a transmission-reception unit for applying a microwave to the wafer and receiving the microwave reflected by the wafer. The gettering determination unit determines whether or not a gettering layer including a grinding strain generated by grinding the wafer has a gettering property. The chuck table holds the wafer on a holding surface. The chuck table has a porous member constituting the holding surface and having a property of transmitting the microwave, a base member provided with a negative pressure transmission passage for transmitting a negative pressure to the porous member, a support member that is disposed on a lower side relative to the porous member to support the porous member, that is provided with a transmission passage for transmitting the negative pressure from the negative pressure transmission passage to the porous member, and that includes a material having a property of transmitting the microwave, and an electromagnetic wave absorber that is disposed on a lower side relative to the support member and that includes a material absorbing the microwave.

Preferably, the electromagnetic wave absorber includes one of a magnetic electromagnetic wave absorber, a dielectric electromagnetic wave absorber, a conductive electromagnetic wave absorber, and a λ/4 type electromagnetic wave absorber.

According to the present invention, the influence of the chuck table holding under suction the wafer on the evaluation of gettering property can be reduced.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
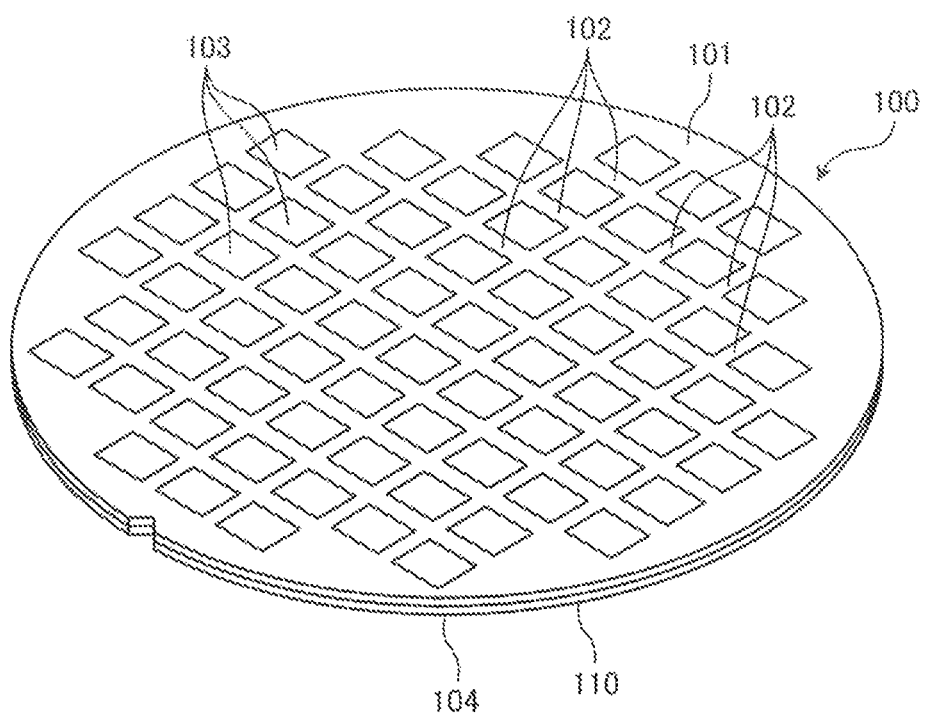
FIG. 1 is a perspective view depicting a wafer as an object of evaluation by a gettering property evaluation apparatus according to a first embodiment.

Embodiments of the present invention will be described in detail below referring to the drawings. The present invention is not limited by the contents of the following description of the embodiments. In addition, the components described below include those which can easily be conceived by a person skilled in the art, and those which are substantially the same. Further, the configurations described below can be combined as required. Besides, various kinds of omission, replacement, or modification are possible within such ranges as not to depart from the gist of the present invention.

[First Embodiment]

Figure 2:
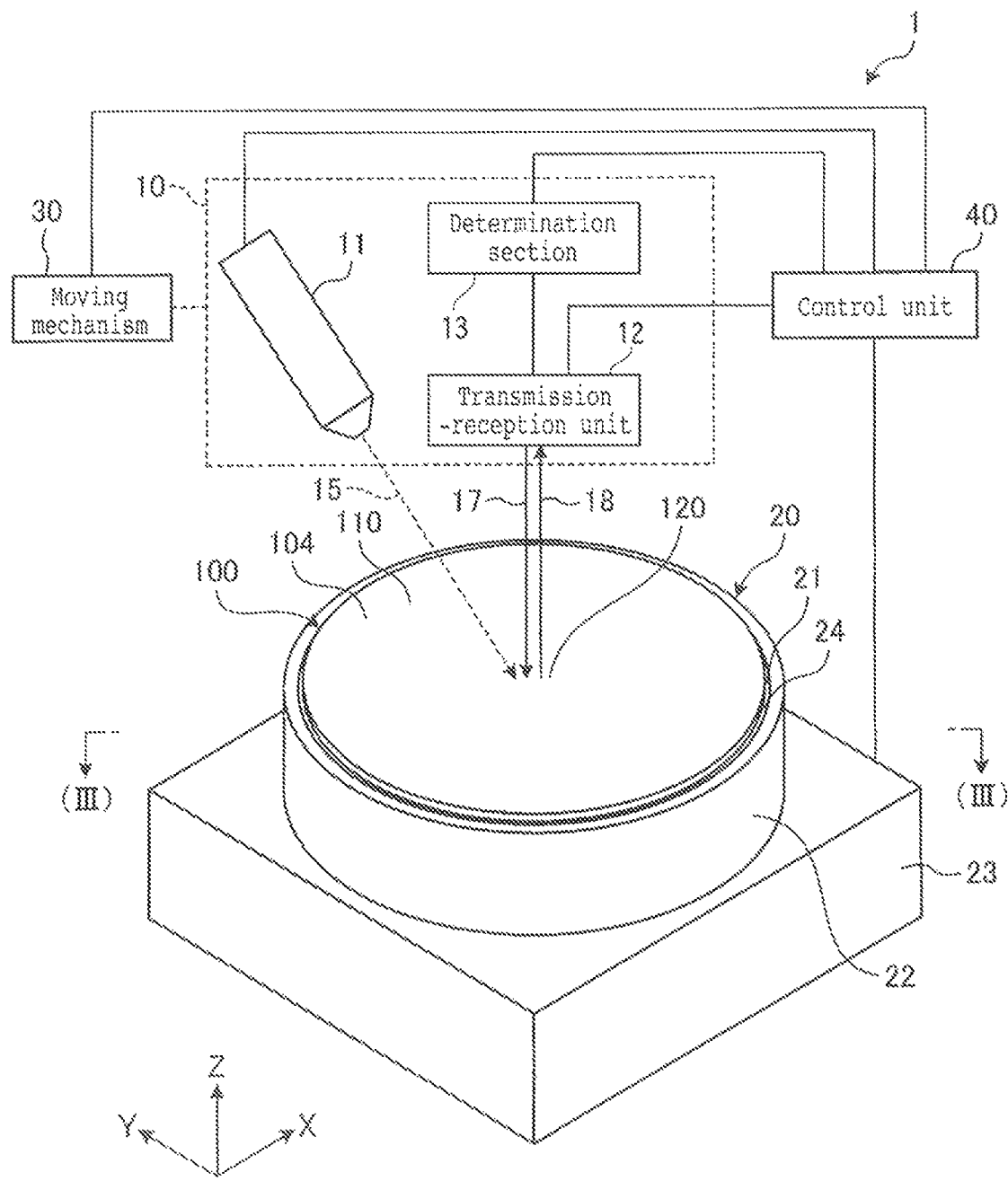
FIG. 2 is a perspective view of a configuration example of the gettering property evaluation apparatus according to the first embodiment.
Figure 3:
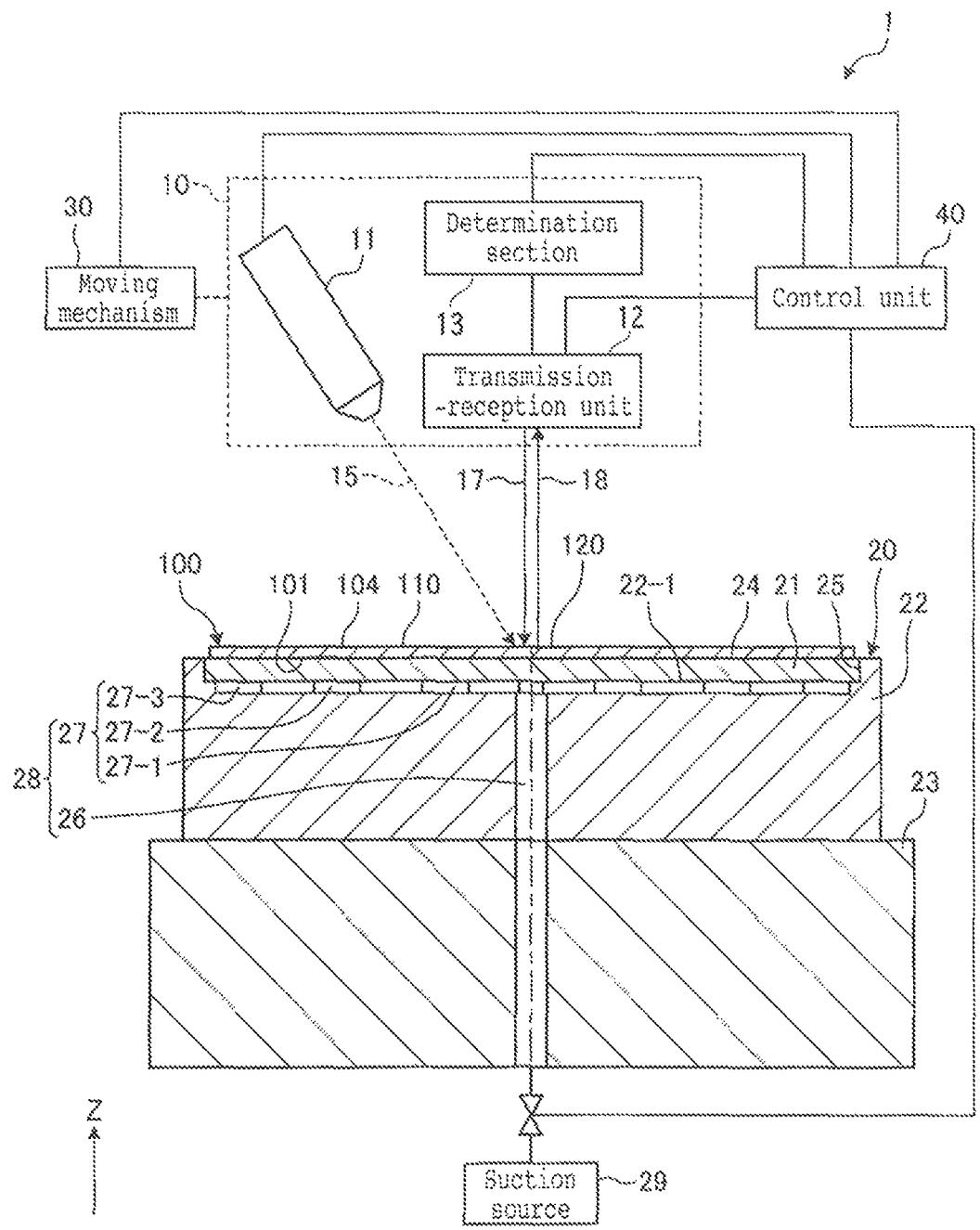
FIG. 3 is a sectional view taken along line III-III of FIG. 2.
Figure 4:
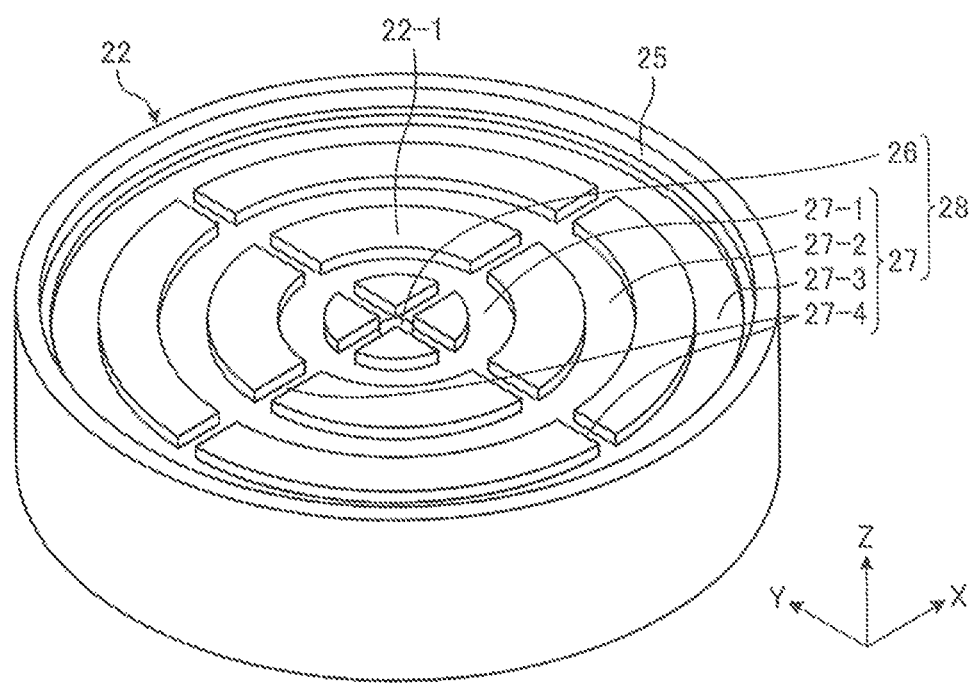
FIG. 4 is a perspective view of a base member of the gettering property evaluation apparatus of FIG. 2.

A gettering property evaluation apparatus 1 according to a first embodiment of the present invention will be described based on the drawings. FIG. 1 is a perspective view depicting a wafer 100 as an object of evaluation by the gettering property evaluation apparatus 1 according to the first embodiment. FIG. 2 is a perspective view of a configuration example of the gettering property evaluation apparatus 1 according to the first embodiment. FIG. 3 is a sectional view taken along line III-III of FIG. 2. FIG. 4 is a perspective view of a base member 22 of the gettering property evaluation apparatus 1 of FIG. 2.

The gettering property evaluation apparatus 1 according to the first embodiment is an apparatus for measuring and evaluating gettering performance (hereinafter referred to as gettering property) of a gettering layer 110 formed in a wafer 100. Here, the gettering layer 110 is a layer that captures metallic elements. Note that, in the first embodiment, the gettering property evaluation apparatus 1 measures and evaluates gettering performance at a plurality of different predetermined positions 120 of the gettering layer 110 formed in the wafer 100, but, in the present invention, the gettering property evaluation apparatus 1 may measure the whole surface of the gettering layer 110 formed in the wafer 100 at predetermined intervals and may measure and evaluate the gettering performance over the whole surface. The wafer 100 as an object of evaluation by the gettering property evaluation apparatus 1 according to the first embodiment is a disk-shaped semiconductor wafer or optical device wafer or the like including silicon, sapphire, gallium arsenide or the like as a basic material. The wafer 100 is formed with devices 103 in regions partitioned by a plurality of streets 102 formed in a grid pattern on a front surface 101 of the wafer 100, as illustrated in FIG. 1.

After the wafer 100 is thinned to a predetermined thickness by subjecting a back surface 104 on the side opposite to the front surface 101 to grinding or the like, the gettering layer 110 is formed in the inside of the wafer 100, and the gettering property of the gettering layer 110 is evaluated by the gettering property evaluation apparatus 1. The gettering property of the gettering layer 110 refers to the magnitude of an effect of restraining movements of metallic elements harmful to the devices 103, such as copper. The devices 103 formed on the front surface 101 of the wafer 100 are, for example, memories (memories such as flash memory and dynamic random access memory (DRAM)), and it is undesirable that the devices 103 are contaminated by metals (for example, copper element) from the back surface 104.

Note that, in the first embodiment, the gettering layer 110 of the wafer 100 includes grinding strains generated by grinding of the back surface 104 of the wafer 100. In the present invention, the gettering layer 110 is not limited to being formed by grinding, but may be formed by other treatment such as dry polishing, wet chemical mechanical polishing (CMP) using a chemical liquid not containing abrasive grains, plasma etching, irradiation with a laser beam, or irradiation with an ion beam.

As depicted in FIGS. 2 and 3, the gettering property evaluation apparatus 1 according to the first embodiment includes a gettering determination unit 10, a chuck table 20, a moving mechanism (moving means) 30, and a control unit 40 that controls each of the sections.

As depicted in FIGS. 2 and 3, the gettering determination unit 10 is means for determining whether or not the gettering layer 110 has a gettering property of a predetermined value, at one predetermined position 120 of a plurality of predetermined positions 120 for evaluating the gettering property, and includes a laser beam applying unit 11, a transmission-reception unit 12, and a determination section 13.

The laser beam applying unit 11 applies a laser beam 15 to the predetermined position 120 of the wafer 100 on the chuck table 20, excites the gettering layer 110 at the predetermined position 120 to generate excessive carriers, thereby increasing the reflectance for a microwave 17 applied from the transmission-reception unit 12. The laser beam 15 applied by the laser beam applying unit 11 is, for example, in a pulsed form, in the first embodiment, and, by having a predetermined wavelength, becomes exciting light for the gettering layer 110. The predetermined wavelength of the laser beam 15 applied by the laser beam applying unit 11, in the first embodiment, is, for example, 904 nm, 532 nm, 349 nm or the like.

The gettering determination unit 10 starts applying the microwave 17 to the predetermined position 120 by the transmission-reception unit 12, and, thereafter, application of the laser beam 15 to the predetermined position 120 to which the microwave 17 has been applied is started by the laser beam applying unit 11. Thereafter, the gettering determination unit 10 stops application of the laser beam 15 by the laser beam applying unit 11, and after a predetermined time has elapsed after the stoppage of the application of the laser beam 15, stops the application of the microwave 17 by the transmission-reception unit 12. The transmission-reception unit 12, during application of the microwave 17, receives a reflected wave 18 of the microwave reflected by the gettering layer 110 at the predetermined position 120 or reflected by the chuck table 20 after being transmitted through the gettering layer 110 at the predetermined position 120. The intensity of the reflected wave 18 of the microwave received by the transmission-reception unit 12 increases due to an increase in reflectance of the microwave 17 attendant on the generation of excessive carriers during application of the laser beam 15, and, after the stoppage of the application of the laser beam 15, the intensity is gradually attenuated due to a gradual lowering in the reflectance of the microwave 17 attendant on recombination of the carriers. The microwave 17 applied by the transmission-reception unit 12 has a frequency of 25 GHz in the first embodiment, but the present invention is not limited to this.

The determination section 13 acquires information concerning the reflected wave 18 of the microwave received by the transmission-reception unit 12, quantitatively determines an element for capturing metallic elements by use of a micro photo conductivity decay (micro-PCD) method, based on the attenuation time of the reflected wave 18 of the microwave, thereby evaluating the gettering property of the gettering layer 110 at the predetermined position 120, and, by comparing the evaluated gettering property with a predetermined value, determines whether or not the gettering layer has a gettering property of the predetermined value.

As depicted in FIGS. 2 and 3, the chuck table 20 has the nonmetallic porous member 21, the base member 22, and a stage 23. The nonmetallic porous member 21 includes a multiplicity of pores and constitute a flat holding surface 24 along a horizontal plane. The nonmetallic porous member 21 has a property of reflecting or absorbing the microwave. In addition, the nonmetallic porous member 21 is conductive and includes a nonmetallic material.

Here, to have a property of reflecting or absorbing the microwave means to have a total of reflectance of the microwave and absorbance of the microwave of equal to or more than 80%. In other words, the nonmetallic porous member 21 has a total of reflectance of the microwave and absorbance of the microwave of equal to or more than 80%. The total of reflectance of the microwave and absorbance of the microwave of the nonmetallic porous member 21 is preferably equal to or more than 90% and is more preferably equal to or more than 95%.

The reflectance of the microwave is the ratio of a flux of the reflected wave of the microwave based on a flux of the microwave before reflection. In addition, the absorbance of the microwave is the ratio of a flux of the microwave absorbed based on a flux of the microwave before absorption. Besides, transmittance of the microwave is the ratio of a flux of the microwave transmitted based on a flux of the microwave before transmission.

In addition, to be conductive means to have a conductivity of equal to or more than $1\times10^{-6}$ S/m. In other words, the nonmetallic porous member 21 has a conductivity of equal to or more than $1\times10^{-6}$ S/m. The nonmetallic porous member 21 preferably has a conductivity of equal to or more than $1\times10^{-5}$ S/m. Since the nonmetallic porous member 21 has such a high conductivity, it suitably has a property of reflecting or absorbing the microwave described above.

Besides, to include a nonmetallic material means to include a material of which the content of metallic elements in a simple substance state is equal to or less than 1 wt %. In other words, the nonmetallic porous member 21 includes a material of which the content of metallic element in a simple substance state is equal to or less than 1 wt %. Since the nonmetallic porous member 21 has such a low content of metallic elements in a simple substance state, contamination of the wafer 100 due to the metallic elements in a simple substance state from the holding surface 24 is restrained suitably.

The nonmetallic porous member 21 includes porous SiC or porous carbon. The nonmetallic porous member 21 may be composed of porous SiC, or may be composed of porous carbon, or may be composed of porous SiC and porous carbon, or may contain a nonmetallic material having a property of reflecting or absorbing microwaves and conductivity like porous SiC and porous carbon. Note that porous SiC and porous carbon may contain an appropriate amount of sintering aid.

The porous SiC includes a multiplicity of pores and is substantially composed of SiC (silicon carbide). For example, the nonmetallic porous member 21 including the porous SiC has a conductivity of approximately $1\times10^{-5}$ S/m, a relative dielectric constant of approximately 10, and a thickness of 3 mm. The nonmetallic porous member 21 has a reflectance of microwave of a frequency of 25 GHz of approximately 47%, an absorbance of microwave of a frequency of 25 GHz of approximately 53%, and a transmittance of microwave of a frequency of 25 GHz of equal to or less than approximately 0.2%. The nonmetallic porous member 21 has a total of the reflectance and absorbance of microwave of a frequency of 25 GHz of approximately 100%. Note that the thickness of the nonmetallic porous member 21 including porous SiC is not limited to 3 mm. In addition, the nonmetallic porous member 21 including porous SiC has a reflectance, an absorbance, and a transmittance of microwave varying according to the thickness, temperature and the like.

The porous carbon includes a multiplicity of pores and is substantially composed of carbon. For example, the nonmetallic porous member 21 including the porous carbon has a conductivity of approximately $1\times10^{4}$ S/m, a relative dielectric constant of approximately 1, and a thickness of 3 mm.

The nonmetallic porous member 21 has a reflectance of microwave of a frequency of 25 GHz of approximately 99.8%, an absorbance of microwave of a frequency of 25 GHz of approximately 0.2%, and a transmittance of microwave of a frequency of 25 GHz of almost 0%. The nonmetallic porous member 21 has a total of the reflectance and the absorbance of microwave of a frequency of 25 GHz of approximately 100%. Note that the thickness of the nonmetallic porous member 21 including the porous carbon is not limited to 3 mm. In addition, the nonmetallic porous member 21 including the porous carbon has a reflectance, an absorbance, and a transmittance of microwave varying according to the thickness, temperature and the like.

The base member 22 is fixed on the stage 23. As depicted in FIG. 4, the base member 22 is formed with a porous member fitting section 25 at an inner peripheral surface of a circular cavity 22-1 formed in a central portion of an upper surface thereof. The base member 22, with the nonmetallic porous member 21 fitted into and fixed to the porous member fitting section 25, surrounds the nonmetallic porous member 21 while exposing the holding surface 24.

As illustrated in FIG. 4, the base member 22 is formed with a suction passage 26 and grooves 27 as an exhaust flow path in a bottom surface of the circular cavity 22-1 located on a lower side of the porous member fitting section 25. The suction passage 26 and the grooves 27 as an exhaust flow path both form ruggedness in the bottom surface of the circular cavity 22-1 of the base member 22. The suction passage 26 penetrates a central portion of the base member 22 in the vertical direction from the bottom surface of the cavity 22-1 and is connected to a suction source 29 through a through-hole formed in a central portion of the stage 23. The grooves 27 as an exhaust flow path have grooves 27-1, 27-2, and 27-3 formed concentrically with one another and four grooves 27-4 that connect the grooves 27-1, 27-2, and 27-3 in a radial direction. The suction passage 26 and the grooves 27 as an exhaust flow path communicate with each other on the bottom surface of the circular cavity 22-1 and constitute a negative pressure transmission passage 28 for transmitting a negative pressure from the suction source 29 to a lower surface of the nonmetallic porous member 21. The negative pressure transmitted to the lower surface of the nonmetallic porous member 21 by the negative pressure transmission passage 28 is transmitted to the holding surface 24 through the multiplicity of pores in the nonmetallic porous member 21.

The chuck table 20 holds under suction the front surface 101 side of the wafer 100 from the lower side on the holding surface 24 by the negative pressure thus transmitted to the holding surface 24 through the multiplicity of pores in the nonmetallic porous member 21 by the negative pressure transmission passage 28 and expose the back surface 104 side of the wafer 100 on the upper side.

As depicted in FIGS. 2 and 3, the moving mechanism 30 is connected to the gettering determination unit 10. The moving mechanism 30 moves the gettering determination unit 10 relatively to the wafer 100 on the chuck table 20, to thereby move the applying position of the laser beam 15 by the laser beam applying unit 11 and the applying position of the microwave 17 by the transmission-reception unit 12, thereby moving the predetermined position 120 where to evaluate gettering property.

The control unit 40 controls the aforementioned components constituting the gettering property evaluation apparatus 1. In other words, the control unit 40 causes the gettering property evaluation apparatus 1 to evaluate the gettering property of the wafer 100. The control unit 40 switches the opening and closing of an on-off valve between the negative pressure transmission passage 28 and the suction source 29.

In the first embodiment, the determination section 13 and the control unit 40 are a single computer capable of executing a computer program. The determination section 13 and the control unit 40 has an arithmetic processing unit having a microprocessor such as a central processing unit (CPU), a storage unit having a memory such as a read only memory (ROM) and a random access memory (RAM), and an input-output interface unit. The arithmetic processing unit executes a computer program stored in the storage unit and generates control signals for controlling the gettering property evaluation apparatus 1. The arithmetic processing unit outputs the generated control signals to the components of the gettering property evaluation apparatus 1 through the input-output interface unit.

Each of the functions of the determination section 13 and the control unit 40 is realized, in the first embodiment, by execution of the computer program stored in the storage unit by the arithmetic processing unit. In the present invention, the determination section 13 and the control unit 40 are not limited to this; for example, they may be realized based on independent computer systems.

An operation of the gettering property evaluation apparatus 1 according to the first embodiment having the aforementioned configuration will be described below. The gettering property evaluation apparatus 1 positions the position 120 for evaluation of gettering property at one of a plurality of predetermined positions 120 and applies a microwave 17 to the wafer 100 held under suction on the holding surface 24 of the chuck table 20 by the transmission-reception unit 12. In a state in which the microwave 17 is applied by the transmission-reception unit 12, the gettering property evaluation apparatus 1 applies a laser beam 15 for a predetermined time by the laser beam applying unit 11 to excite the gettering layer 110 and generate excessive carriers, and, thereafter, stops the application of the laser beam 15 by the laser beam applying unit 11. During when the microwave 17 is applied by the transmission-reception unit 12, the gettering property evaluation apparatus 1 receives the reflected wave 18 of microwave that is reflected by the gettering layer 110 containing excessive carriers generated therein or is reflected by the chuck table 20 after the microwave 17 is transmitted through the excited gettering layer 110, by the transmission-reception unit 12. Based on an attenuation time of the reflected wave 18 of microwave received by the transmission-reception unit 12, the gettering property evaluation apparatus 1 evaluates the gettering property of the gettering layer 110 at one predetermined position 120 described above, by the determination section 13.

Then, the gettering property evaluation apparatus 1 moves the gettering determination unit 10 relatively to the wafer 100 on the chuck table 20 by the moving mechanism 30, to thereby position the position 120 for evaluation of gettering property at another next one of the plurality of predetermined positions 120, and evaluate the gettering property of the gettering layer 110 similarly to the above. In this way, the gettering property evaluation apparatus 1 sequentially positions the plurality of predetermined positions 120 one by one, to perform evaluation of the gettering property of the gettering layer 110.

In the gettering property evaluation apparatus 1 according to the first embodiment, the chuck table 20 has the conductive nonmetallic porous member 21 constituting the holding surface 24 and having a property of reflecting or absorbing microwaves. Therefore, in the gettering property evaluation apparatus 1 according to the first embodiment, 80% or more of a flux of the microwave 17 applied by the transmission-reception unit 12 is reflected or absorbed by the flat holding surface 24 of the nonmetallic porous member 21, and the reflected part becomes a part of the reflected wave 18 of microwave and is received by the transmission-reception unit 12, so that the reflected part does not reach the ruggedness of the base member 22. Besides, in the gettering property evaluation apparatus 1 according to the first embodiment, the component having become a part of the reflected wave 18 of microwave by being reflected by the flat holding surface 24 of the nonmetallic porous member 21 becomes a direct current (DC) component on a measurement signal dealt with by the transmission-reception unit 12 and the determination section 13, and, therefore, the determination section 13 can easily remove this component from the measurement signal. Therefore, the gettering property evaluation apparatus 1 according to the first embodiment can reduce the possibility that the intensity of the reflected wave 18 of microwave may be varied by the ruggedness of the base member 22 when the predetermined position 120 is moved, that is, can make uniform the intensity of the reflected wave 18 of microwave irrespectively of the predetermined position 120, so that the gettering property evaluation apparatus 1 produces an effect that the influence of the chuck table 20 holding under suction the wafer 100 on the evaluation of the gettering property can be reduced.

In the gettering property evaluation apparatus 1 according to the first embodiment, the nonmetallic porous member 21 includes porous SiC or porous carbon. Therefore, the gettering property evaluation apparatus 1 according to the first embodiment can cause a flux of the microwave 17 in a higher proportion to be reflected or absorbed by the flat holding surface 24 of the nonmetallic porous member 21, and, therefore, can securely reduce the possibility that the intensity of the reflected wave 18 of microwave may be varied by the ruggedness of the base member 22 when the predetermined position 120 is moved, and produces an effect that the influence of the chuck table 20 holding under suction the wafer 100 on the evaluation of gettering property can securely be reduced.

[First Modification]

Figure 5:
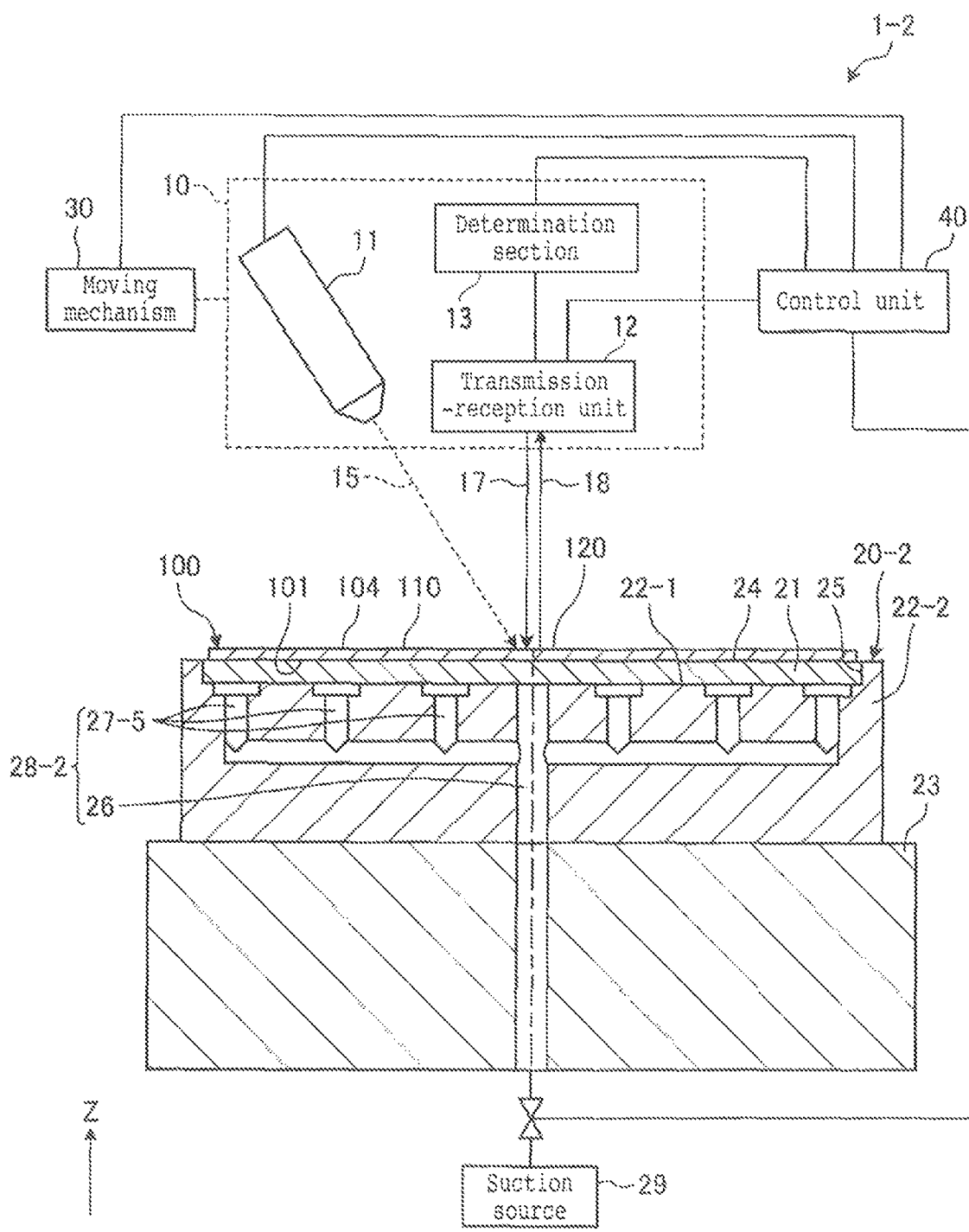
FIG. 5 is a sectional view of a gettering property evaluation apparatus according to a modification (first modification) of the first embodiment.

A gettering property evaluation apparatus 1-2 according to a modification (first modification) of the first embodiment of the present invention will be described based on the drawings. FIG. 5 is a sectional view of the gettering property evaluation apparatus 1 according to the first modification. In FIG. 5, the same parts as those in the first embodiment above are denoted by the same reference symbols as used above, and descriptions thereof are omitted.

As illustrated in FIG. 5, the gettering property evaluation apparatus 1-2 according to the first modification has a configuration in which the chuck table 20 in the gettering property evaluation apparatus 1 according to the first embodiment is replaced by a chuck table 20-2. The chuck table 20-2 has a configuration in which the base member 22 provided with the negative pressure transmission passage 28 including the suction passage 26 and the grooves 27 as an exhaust flow path is changed to a base member 22-2 provided with a negative pressure transmission passage 28-2 including the suction passage 26 and a plurality of through-holes 27-5. The plurality of through-holes 27-5 penetrate the base member 22-2 in the vertical direction and communicate with the suction passage 26 on a bottom surface of a circular cavity 22-1. The suction passage 26 and the plurality of through-holes 27-5 both form ruggedness in a bottom surface of the circular cavity 22-1 of the base member 22-2.

The gettering property evaluation apparatus 1-2 according to the first modification has a configuration in which the grooves 27 as an exhaust flow path constituting the negative pressure transmission passage 28 in the gettering property evaluation apparatus 1 according to the first embodiment is changed to the plurality of through-holes 27-5 constituting the negative pressure transmission passage 28-2. Therefore, the gettering property evaluation apparatus 1-2 according to the first modification produces an effect similar to that of the gettering property evaluation apparatus 1 according to the first embodiment.

[Second Embodiment]

Figure 6:
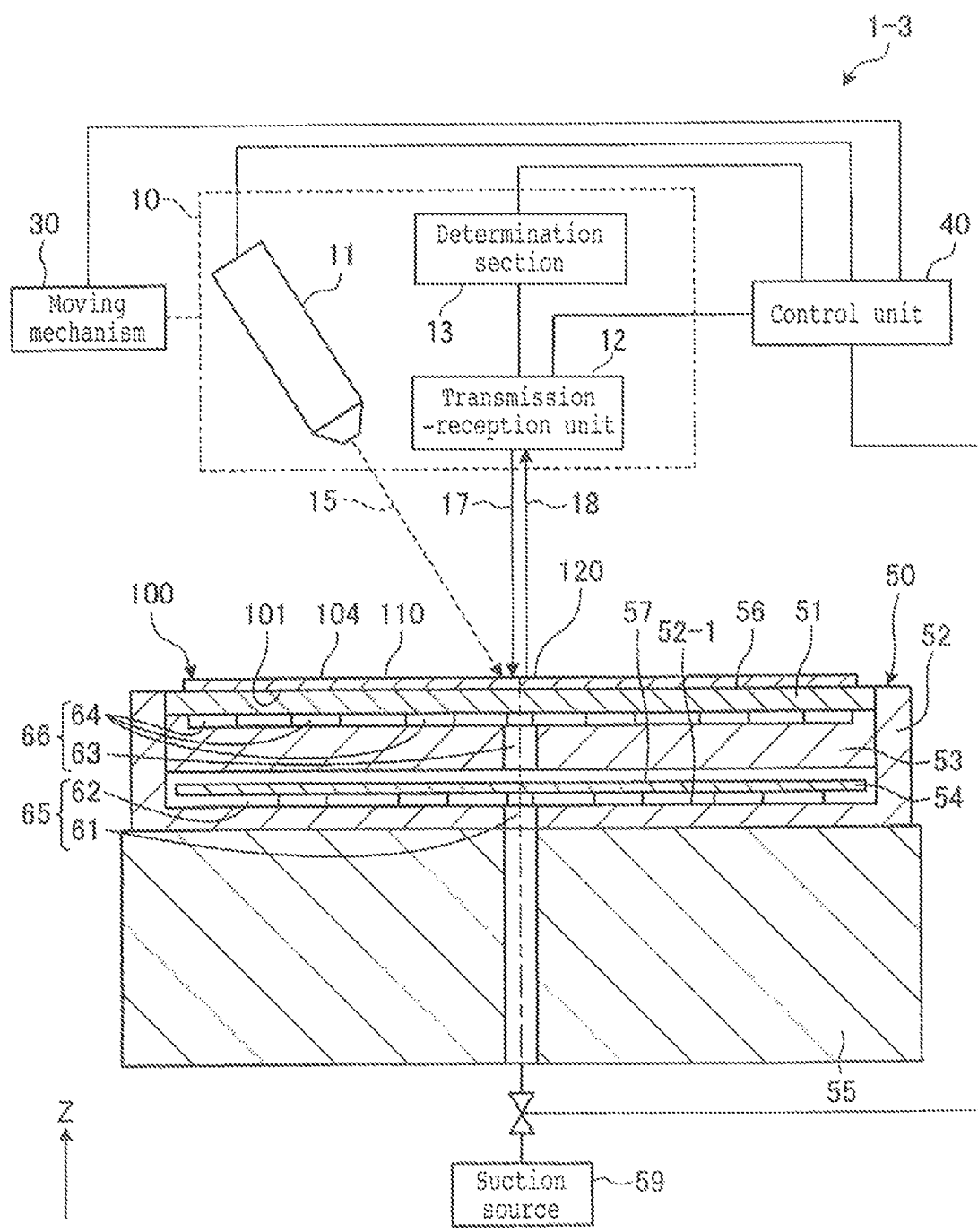
FIG. 6 is a sectional view of a configuration example of a gettering property evaluation apparatus according to a second embodiment.
Figure 7:
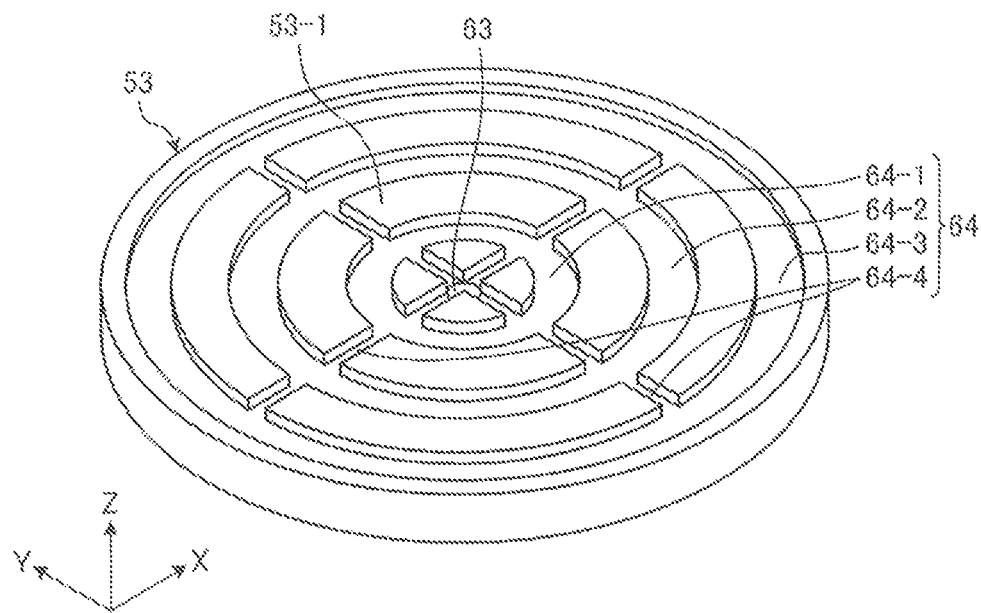
FIG. 7 is a perspective view of a support member of the gettering property evaluation apparatus of FIG. 6.
Figure 8:
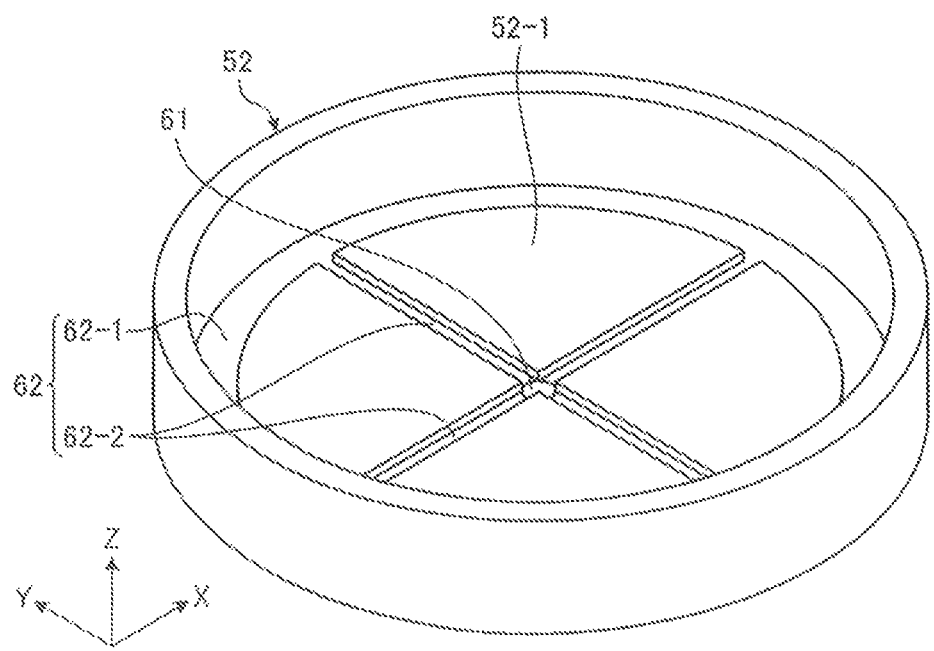
FIG. 8 is a perspective view of a base member of the gettering property evaluation apparatus of FIG. 6.

A gettering property evaluation apparatus 1-3 according to a second embodiment of the present invention will be described based on the drawings. FIG. 6 is a perspective view of a configuration example of the gettering property evaluation apparatus 1-3 according to the second embodiment. FIG. 7 is a perspective view of a support member 53 of the gettering property evaluation apparatus 1-3 of FIG. 6. FIG. 8 is a perspective view of a base member 52 of the gettering property evaluation apparatus 1-3 of FIG. 6. In FIGS. 6 to 8, the same parts as those in the first embodiment above are denoted by the same reference symbols as used above, and descriptions thereof are omitted.

The gettering property evaluation apparatus 1-3 according to the second embodiment has a configuration in which, as depicted in FIG. 6, the chuck table 20 in the gettering property evaluation apparatus 1 according to the first embodiment is changed to a chuck table 50. As illustrated in FIG. 6, the chuck table 50 includes a porous member 51, the base member 52, the support member 53, a reflective plate 54, and a stage 55.

The porous member 51 constitutes a holding surface 56 similar to the holding surface 24 and has a property of transmitting microwaves. Here, to have a property of transmitting microwaves means that transmittance of microwaves is equal to or more than 80%. In other words, the porous member 51 has a transmittance of microwaves of equal to or more than 80%. The transmittance of microwaves of the porous member 51 is preferably equal to or more than 90% and more preferably equal to or more than 95%.

In addition, the porous member 51 is not conductive, or its conductivity is less than $1\times10^{-6}$ S/m. In other words, the porous member 51 has a conductivity of less than $1\times10^{-6}$ S/m. The porous member 51 preferably has a conductivity of less than $1\times10^{-10}$ S/m. Since the porous member 51 has such a low conductivity, it suitably has a property of transmitting microwaves described above. Besides, the porous member 51 includes a nonmetallic material similar to the nonmetallic porous member 21.

The porous member 51 includes a porous alumina ceramic. The porous member 51 may be composed of a porous alumina ceramic or may contain a material which has a property of transmitting microwaves like the porous alumina ceramic and which is not conductive. Note that the porous alumina ceramic may contain a suitable amount of sintering aid.

The porous alumina ceramic includes a multiplicity of pores and is substantially composed of alumina ceramic. For example, the porous member 51 including the porous alumina ceramic has a conductivity of less than $1\times10^{-14}$ S/m and has a thickness of 3 mm. The porous member 51 has a transmittance of microwave of a frequency of 25 GHz of approximately 100%, a reflectance of microwave of a frequency of 25 GHz of approximately 0%, and an absorbance of microwave of a frequency of 25 GHz of approximately 0%. The porous member 51 has a total of reflectance and absorbance of microwave of frequency of 25 GHz of approximately 0%. Note that the thickness of the porous member 51 including the porous alumina ceramic is not limited to 3 mm. The porous member 51 has a transmittance of microwave of a frequency of 25 GHz of substantially 100%, almost regardless of the thickness, temperature and the like.

The base member 52 is fixed on the stage 55. As depicted in FIG. 6, the base member 52 holds the support member 53 on an inner peripheral surface of a circular cavity 52-1 formed in a central portion of an upper surface thereof. The base member 52 is formed with a space in which to dispose the reflective plate 54, on a lower side of a position for holding the support member 53. The base member 52 holds the support member 53 by the inner peripheral surface of the circular cavity 52-1, and the porous member 51 is supported on the support member 53, whereby the base member 52 surrounds the porous member 51 while exposing the holding surface 56.

As depicted in FIG. 8, the base member 52 is formed with a suction passage 61 and grooves 62 as an exhaust flow path, in a bottom surface of the circular cavity 52-1. The suction passage 61 and the grooves 62 as the exhaust flow path both form ruggedness in the bottom surface of the circular cavity 52-1 of the base member 52. The suction passage 61 penetrates a central portion of the base member 52 in the vertical direction from the bottom surface of the cavity 52-1 and is connected to a suction source 59 through a through-hole formed in a central portion of the stage 55. The grooves 62 as the exhaust flow path has a groove 62-1 formed in a circular shape at the periphery, and grooves 62-2 connecting the groove 62-1 in radial directions. The suction passage 61 and the grooves 62 as the exhaust flow path communicate with each other on the bottom surface of the circular cavity 52-1 and constitute a negative pressure transmission passage 65 for transmitting a negative pressure from the suction source 59 to a lower surface of the support member 53.

As illustrated in FIG. 6, the support member 53 is disposed on a lower side relative to the porous member 51 and supports the porous member 51 on an upper surface 53-1 thereof. The support member 53 includes a material having a property of transmitting microwaves, similarly to the porous member 51.

The support member 53 includes at least one of alumina ceramic and polyacetal. The support member 53 may be composed of alumina ceramic, or may be composed of polyacetal, or may be composed of alumina ceramic and polyacetal, or may contain a material which has a property of transmitting microwaves like alumina ceramic and polyacetal and which is not conductive. Note that the alumina ceramic and the polyacetal may contain a suitable amount of sintering aid, additives or the like.

For example, the support member 53 including the alumina ceramic has a conductivity of less than $1 \times 10^{-14}$ S/m and a thickness of 10 mm. The support member 53 has a transmittance of microwave of a frequency of 25 GHz of approximately 100%, a reflectance of microwave of a frequency of 25 GHz of approximately 0%, and an absorbance of microwave of a frequency of 25 GHz of approximately 0%. The support member 53 has a total of reflectance and absorbance of microwave of a frequency of 25 GHz of approximately 0%. Note that the thickness of the support member 53 including the alumina ceramic is not limited to 10 mm. The support member 53 has a transmittance of microwave of a frequency of 25 GHz of substantially 100%, almost regardless of the thickness, temperature and the like.

In addition, the support member including polyacetal has a conductivity of less than $1 \times 10^{-14}$ S/m and a thickness of 10 mm. The support member 53 has a transmittance of microwave of a frequency of 25 GHz of approximately 100%, a reflectance of microwave of a frequency of 25 GHz of approximately 0%, and an absorbance of microwave of a frequency of 25 GHz of approximately 0%. The support member 53 has a total of reflectance and absorbance of microwave of a frequency of 25 GHz of approximately 0%. Note that the thickness of the support member 53 including the polyacetal is not limited to 10 mm. The support member 53 has a transmittance of microwave of a frequency of 25 GHz of substantially 100%, almost regardless of the thickness, temperature and the like.

As depicted in FIG. 7, the support member 53 is formed with a suction passage 63 and grooves 64 as an exhaust flow path in an upper surface 53-1 thereof. The suction passage 63 and the grooves 64 as the exhaust flow path both form ruggedness in the upper surface 53-1 of the support member 53. The suction passage 63 is formed to penetrate a central portion of the support member 53 in the vertical direction and is connected to a suction source 59 through a negative pressure transmission passage 65 and a through-hole formed in a central portion of the stage 55. The grooves 64 as the exhaust flow path has grooves 64-1, 64-2, and 64-3 formed concentrically with each other, and four grooves 64-4 connecting the grooves 64-1, 64-2, and 64-3 in radial directions. The suction passage 63 and the grooves 64 as the exhaust flow path communicate with each other on the upper surface 53-1 and constitute a transmission passage 66 for transmitting a negative pressure from the negative pressure transmission passage 65 to a lower surface of the porous member 51. The negative pressure transmitted to the lower surface of the porous member 51 by the transmission passage 66 is transmitted to the holding surface 56 through a multiplicity of pores in the porous member 51.

By the negative pressure thus transmitted to the holding surface 56 through the multiplicity of pores in the porous member 51 by the negative pressure transmission passage 65 and the transmission passage 66, the chuck table 50 holds under suction the front surface 101 side of the wafer 100 from the lower side by the holding surface 56 and exposes the back surface 104 side of the wafer 100 on the upper side.

The reflective plate 54 is disposed on the lower side of the support member 53. Specifically, the reflective plate 54 is disposed in a space formed on the lower side of a position of holding the support member 53, in the circular cavity 52-1 of the base member 52. The reflective plate 54 is disposed on the lower side of the porous member 51 and the support member 53 and on the upper side relative to the ruggedness (the suction passage 61 and the grooves 62 as the exhaust flow path) of the circular cavity 52-1.

The reflective plate 54 has a flat front surface 57 and includes a conductive material that reflects microwaves. Here, to reflect microwaves means that reflectance of microwaves is equal to or more than 80%. In other words, the reflective plate 54 has a reflectance of microwaves of equal to or more than 80%. The reflective plate 54 has a reflectance of microwave of preferably equal to or more than 90% and more preferably equal to or more than 95%. In addition, the conductive material means a material that is conductive, and, as aforementioned, means a material that has a conductivity of equal to or more than $1 \times 10^{-6}$ S/m. Since the reflective plate 54 has such a high conductivity, it suitably has a property of reflecting microwaves described above.

The reflective plate 54 includes one of stainless steel, iron, an ion-containing alloy, aluminum, an aluminum-containing alloy, copper, a copper-containing alloy, titanium, and CFRP. The reflective plate 54 may be composed of one of stainless steel, iron, an iron-containing alloy, aluminum, an aluminum-containing alloy, copper, a copper-containing alloy, titanium, and CFRP or may be composed of a composite material of two or more of these. The reflective plate 54 may contain a conductive material that has a property of reflecting microwaves similar to stainless steel, iron, an iron-containing alloy, aluminum, an aluminum-containing alloy, copper, a copper-containing alloy, titanium, and CFRP. Note that the reflective plate 54 may contain a suitable amount of additives.

The reflective plates 54 including stainless steel, iron, an iron-containing alloy, aluminum, an aluminum-containing alloy, copper, a copper-containing alloy, titanium, or CFRP all have high conductivity and have a thickness of 3 mm. The reflective plate 54 has a reflectance of microwave of a frequency of 25 GHz of approximately 100%, an absorbance of microwave of a frequency of 25 GHz of almost 0%, and a transmittance of microwave of a frequency of 25 GHz of almost 0%. Note that the thickness of the reflective plate 54 including stainless steel, iron, an iron-containing alloy, aluminum, an aluminum-containing alloy, copper, a copper-containing alloy, titanium, or CFRP is not limited to 3 mm, and the reflectance, absorbance, and transmittance of microwave vary according to the thickness, temperature and the like.

In the gettering property evaluation apparatus 1-3 according to the second embodiment having the above-mentioned configuration, the chuck table 50 is disposed on the lower side relative to the porous member 51 having a property of transmitting microwaves and the support member 53 and includes the reflective plate 54 having a flat front surface 57 including a conductive material that reflects microwaves. Therefore, in the gettering property evaluation apparatus 1-3 according to the second embodiment, 80% or more of a flux of the microwave 17 applied by the transmission-reception unit 12 is transmitted through the ruggedness of the support member 53, is reflected by the flat front surface 57 of the reflective plate 54, becomes a part of the reflected wave 18 of microwave, and is received by the transmission-reception unit 12, so that it does not reach the ruggedness of the base member 52. In the gettering property evaluation apparatus 1-3 according to the second embodiment, the component reflected by the flat front surface 57 of the reflective plate 54 to become a part of the reflected wave 18 of microwave becomes a DC component on a measurement signal dealt with by the transmission-reception unit 12 and the determination section 13, and, therefore, the determination section 13 can easily remove this component from the measurement signal. Therefore, the gettering property evaluation apparatus 1-3 according to the second embodiment can reduce the possibility that the intensity of the reflected wave 18 of microwave may be varied by the ruggedness of the base member 52 and the ruggedness of the support member 53 when the predetermined position 120 is moved, and, accordingly, the gettering property evaluation apparatus 1-3 produces an effect that the influence of the chuck table 50 holding under suction the wafer 100 on the evaluation of gettering property can be reduced.

In the gettering property evaluation apparatus 1-3 according to the second embodiment, the reflective plate 54 includes one of stainless steel, iron, an iron-containing alloy, aluminum, an aluminum-containing alloy, copper, a copper-containing alloy, titanium, and CFRP. Therefore, the gettering property evaluation apparatus 1-3 according to the second embodiment can reflect a higher proportion of a flux of the microwave 17 by the flat front surface 57 of the reflective plate 54, and, accordingly, the gettering property evaluation apparatus 1-3 can securely reduce the possibility that the intensity of the reflected wave 18 of microwave may be varied by the ruggedness of the base member 52 and the ruggedness of the support member 53 when the predetermined position 120 is moved, and produces an effect that the influence of the chuck table 50 holding under suction the wafer 100 on the evaluation of gettering property can securely be reduced.

[Second Modification]

Figure 9:
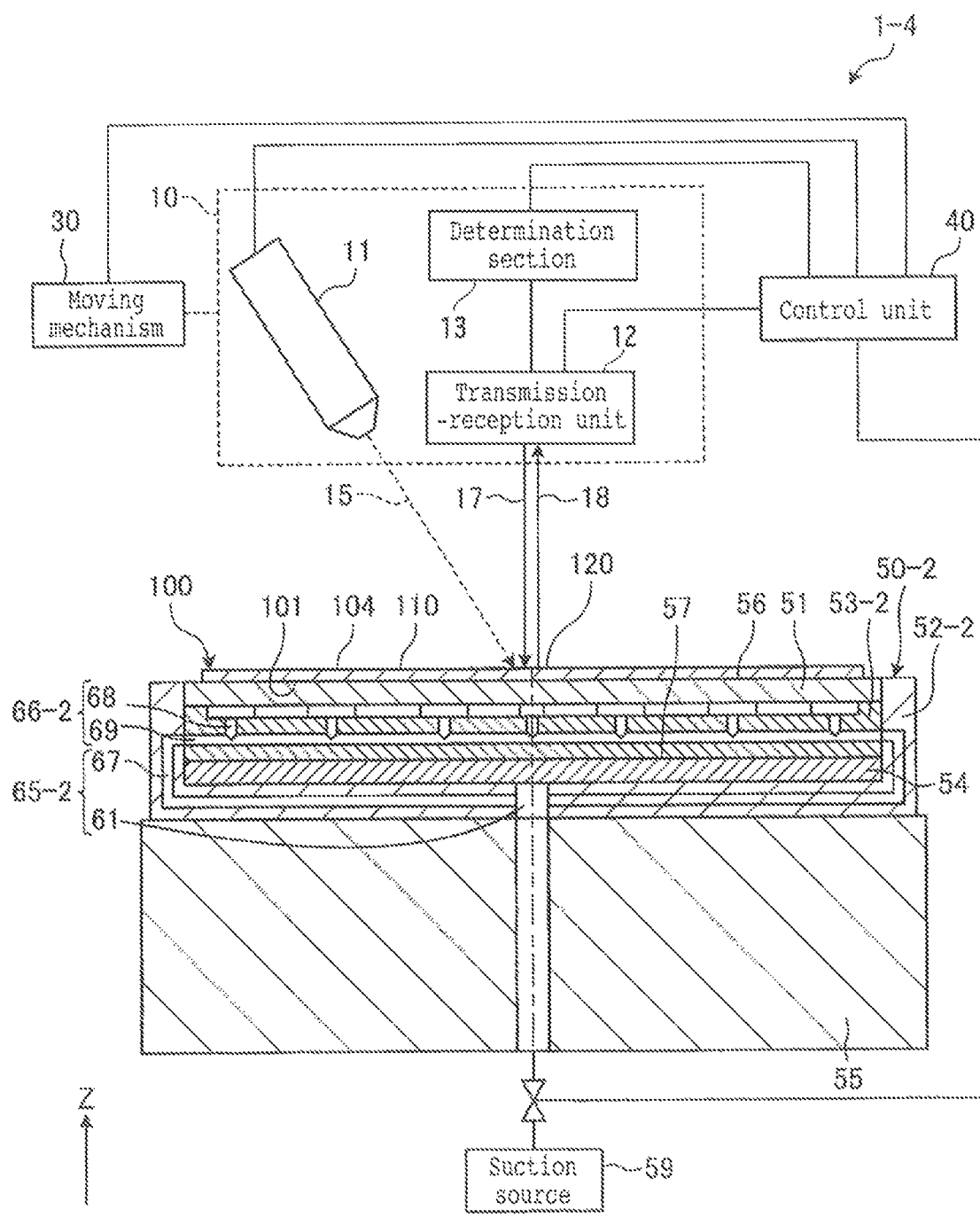
FIG. 9 is a sectional view of a gettering property evaluation apparatus according to a modification (second modification) of the second embodiment.

A gettering property evaluation apparatus 1-4 according to a modification (second modification) of the second embodiment of the present invention will be described based on the drawings. FIG. 9 is a sectional view of the gettering property evaluation apparatus 1-4 according to the second modification. In FIG. 9, the same parts as those in the second embodiment above are denoted by the same reference symbols as used above, and descriptions thereof are omitted.

As illustrated in FIG. 9, the gettering property evaluation apparatus 1-4 according to the second modification has a configuration in which the chuck table 50 in the gettering property evaluation apparatus 1-3 according to the second embodiment is changed to a chuck table 50-2. The chuck table 50-2 has a configuration in which the base member 52 in the chuck table 50 is changed to a base member 52-2, and the support member 53 is changed to a support member 53-2.

The base member 52-2 has a configuration in which the grooves 62 as the exhaust flow path in the base member 52 are replaced by a plurality of suction passages 67 formed in the inside of the base member 52-2. The suction passage 61 forms ruggedness in a bottom surface of a circular cavity of the base member 52-2. The suction passage 61 and the plurality of suction passages 67 formed in the base member 52-2 communicate with each other and constitute a negative pressure transmission passage 65-2 for transmitting a negative pressure from a suction source 59 to the inside of the support member 53-2.

The support member 53-2 has a configuration in which the suction passage 63 and the grooves 64 as the exhaust flow path in the support member 53 are replaced by a plurality of holes 68 and a suction passage 69. The plurality of holes 68 are formed in a depth of an upper half from an upper surface of the support member 53-2 and communicate with the suction passage 69 on the lower side. The suction passage 69 connects the plurality of holes 68 in the radial direction and communicates with the plurality of suction passages 67 of the negative pressure transmission passage 65-2 at the periphery. The plurality of holes 68 form ruggedness in an upper surface of the support member 53-2. The plurality of holes 68 and the suction passage 69 formed in the support member 53-2 communicate with each other and constitute a transmission passage 66-2 for transmitting a negative pressure from the negative pressure transmission passage 65-2 to a lower surface of the porous member 51.

The gettering property evaluation apparatus 1-4 according to the second modification has a configuration in which the negative pressure transmission passage 65 and the transmission passage 66 in the gettering property evaluation apparatus 1-3 according to the second embodiment are changed in structure and are changed to the negative pressure transmission passage 65-2 and the transmission passage 66-2. Therefore, the gettering property evaluation apparatus 1-4 according to the second modification produces an effect similar to that of the gettering property evaluation apparatus 1-3 according to the second embodiment.

[Third Embodiment]

Figure 10:
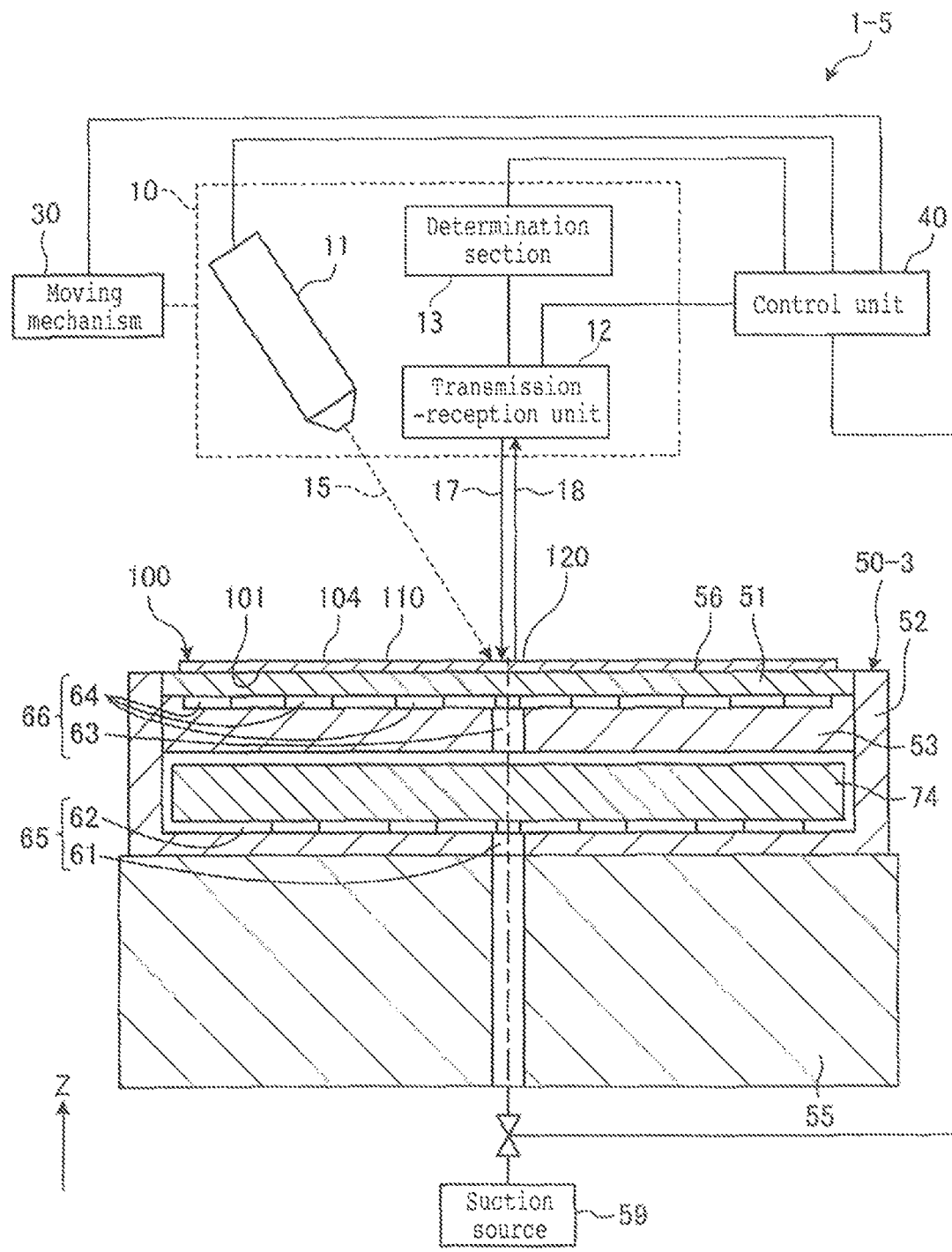
FIG. 10 is a sectional view of a configuration example of a gettering property evaluation apparatus according to a third embodiment.

A gettering property evaluation apparatus 1-5 according to a third embodiment will be described based on the drawings. FIG. 10 is a sectional view of a configuration example of the gettering property evaluation apparatus 1-5 according to the third embodiment. In FIG. 10, the same parts as those in the second embodiment above are denoted by the same reference symbols as used above, and descriptions thereof are omitted.

As illustrated in FIG. 10, the gettering property evaluation apparatus 1-5 according to the third embodiment has a configuration in which the chuck table 50 in the gettering property evaluation apparatus 1-3 according to the second embodiment is changed to a chuck table 50-3. The chuck table 50-3 has a configuration in which the reflective plate 54 in the chuck table 50 is changed to an electromagnetic wave absorber 74.

The electromagnetic wave absorber 74 is disposed on the lower side relative to a support member 53, similarly to the reflective plate 54 according to the second embodiment. Specifically, similarly to the reflective plate 54 in the second embodiment, the electromagnetic wave absorber 74 is disposed in a space formed on the lower side of a position of holding the support member 53, in a circular cavity 52-1 of a base member 52. The electromagnetic wave absorber 74 is disposed on the lower side of the porous member 51 and the support member 53 and on the upper side relative to ruggedness (a suction passage 61 and grooves 62 as an exhaust flow path) in a bottom surface of the circular cavity 52-1.

The electromagnetic wave absorber 74 includes a material that absorbs microwaves. Here, to absorb microwaves means that absorbance of microwaves is equal to or more than 80%. In other words, the electromagnetic wave absorber 74 has an absorbance of microwave of equal to or more than 80%. The electromagnetic wave absorber 74 has an absorbance of microwave of preferably equal to or more than 90% and more preferably equal to or more than 95%.

As the electromagnetic wave absorber 74, a material including one of a magnetic electromagnetic wave absorber, a dielectric electromagnetic wave absorber, a conductive electromagnetic wave absorber, and a λ/4 type electromagnetic wave absorber is used suitably. The magnetic electromagnetic wave absorber, the dielectric electromagnetic wave absorber, the conductive electromagnetic wave absorber, and the λ/4 type electromagnetic wave absorber all have an absorbance of microwave of approximately 100%, in a case where, for example, the thickness thereof is 3 mm.

In the gettering property evaluation apparatus 1-5 according to the third embodiment configured as above, a chuck table 50-3 is disposed on the lower side of the porous member 51 having a property of transmitting microwaves and the support member 53 and includes the electromagnetic wave absorber 74 including a material that absorbs microwaves. Therefore, in the gettering property evaluation apparatus 1-5 according to the third embodiment, 80% or more of a flux of microwave 17 applied by a transmission-reception unit 12 is transmitted through ruggedness of the support member 53 and is absorbed by the electromagnetic wave absorber 74, so that it does not reach the ruggedness of the base member 52. Therefore, similarly to the gettering property evaluation apparatus 1-3 according to the second embodiment, the gettering property evaluation apparatus 1-5 according to the third embodiment can reduce the possibility that the intensity of the reflected wave 18 of microwave may be varied by the ruggedness of the base member 52 and the ruggedness of the support member 53 when a predetermined position 120 is moved, so that the gettering property evaluation apparatus 1-5 produces an effect that the influence of a chuck table 50-3 holding under suction a wafer 100 on the evaluation of gettering property can be reduced.

In the gettering property evaluation apparatus 1-5 according to the third embodiment, the electromagnetic wave absorber 74 includes one of the magnetic electromagnetic wave absorber, the dielectric electromagnetic wave absorber, the conductive electromagnetic wave absorber, and the λ/4 type electromagnetic wave absorber. Therefore, the gettering property evaluation apparatus 1-5 according to the third embodiment can absorb a higher proportion of a flux of microwave 17 by the electromagnetic wave absorber 74, and, therefore, it can securely reduce the possibility that the intensity of the reflected wave 18 of microwave may be varied by the ruggedness of the base member 52 and the ruggedness of the support member 53 when the predetermined position 120 is moved, and it produces an effect that the influence of the chuck table 50 holding under suction the wafer 100 on the evaluation of gettering property can securely be reduced.

Note that, in the gettering property evaluation apparatus 1-5 according to the third embodiment, in a case where a foamed material such as polyurethane is used as the electromagnetic wave absorber 74, if the foamed material is open cell, the open cell provides an action similar to that of the negative pressure transmission passage 65, and, therefore, it is unnecessary to provide the base member 52 with the negative pressure transmission passage 65 (a suction passage 61 and grooves 62 as an exhaust flow path).

[Fourth Embodiment]

Figure 11:
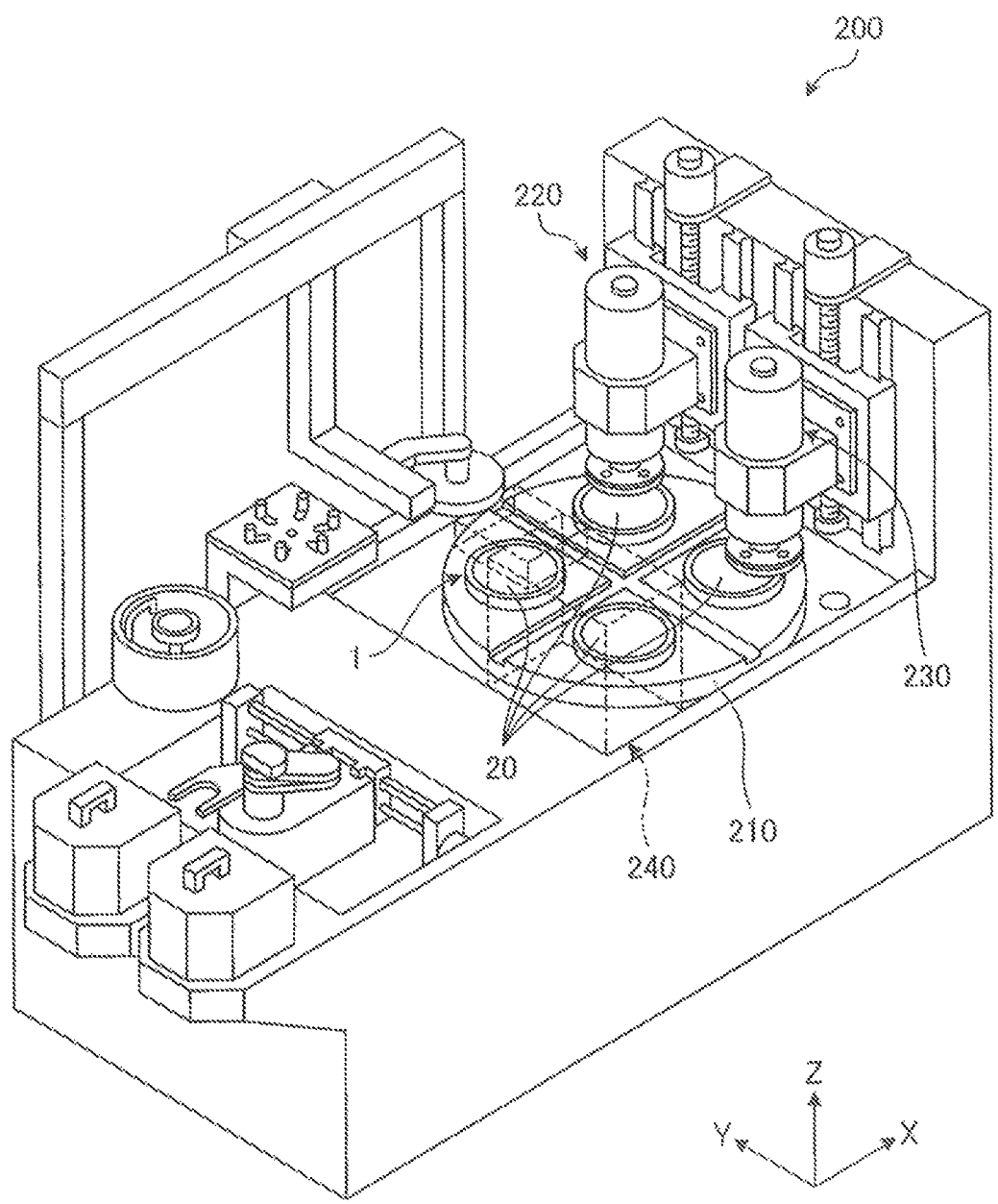
FIG. 11 is a perspective view of a configuration example of a grinding and polishing apparatus according to a fourth embodiment.

A grinding and polishing apparatus 200 according to a fourth embodiment of the present invention will be described based on the drawings. FIG. 11 is a perspective view of a configuration example of the grinding and polishing apparatus according to the fourth embodiment. In FIG. 11, the same parts as those in the above-described embodiments are denoted by the same reference symbols as used above, and descriptions thereof are omitted.

As illustrated in FIG. 11, the grinding and polishing apparatus 200 according to the fourth embodiment has the chuck table 20 according to the first embodiment disposed on a turntable 210, and the gettering determination unit 10 according to the first embodiment is provided directed toward a carrying-in/out position for a wafer 100 on the turntable 210. Thus, the grinding and polishing apparatus 200 according to the fourth embodiment has incorporated therein the gettering property evaluation apparatus 1 according to the first embodiment.

The grinding and polishing apparatus 200 according to the fourth embodiment, after the wafer 100 held under suction on the chuck table 20 is subjected to rough grinding, finish grinding, and polishing at a rough grinding position, a finish grinding position, and a polishing position on the turntable 210 by a rough grinding unit 220, a finish grinding unit 230, and a polishing unit 240, evaluates gettering property of a gettering layer 110 formed in the wafer 100 by the rough grinding, finish grinding, and polishing by the gettering determination unit 10 at the carrying-in/out position.

Since the grinding and polishing apparatus 200 according to the fourth embodiment includes the gettering property evaluation apparatus 1 according to the first embodiment and evaluates gettering property by the gettering property evaluation apparatus 1 according to the first embodiment, the grinding and polishing apparatus 200 produces an effect similar to that of the gettering property evaluation apparatus 1 according to the first embodiment. In addition, the grinding and polishing apparatus according to the fourth embodiment produces an effect that the gettering layer 110 formed on a back surface 104 side of the wafer 100 by the rough grinding by the rough grinding unit 220, the finish grinding by the finish grinding unit 230, and the polishing by the polishing unit 240 can easily be subjected, directly after the grinding and polishing, to evaluation of gettering property by the gettering property evaluation apparatus 1 according to the first embodiment that is present in the same apparatus.

Note that, in the present invention, in place of the chuck table 20 according to the first embodiment, any of the chuck tables 20-2, 50, 50-2, and 50-3 according to the other embodiments and modifications may be disposed on the turntable 210.

EXAMPLE

Figure 12:
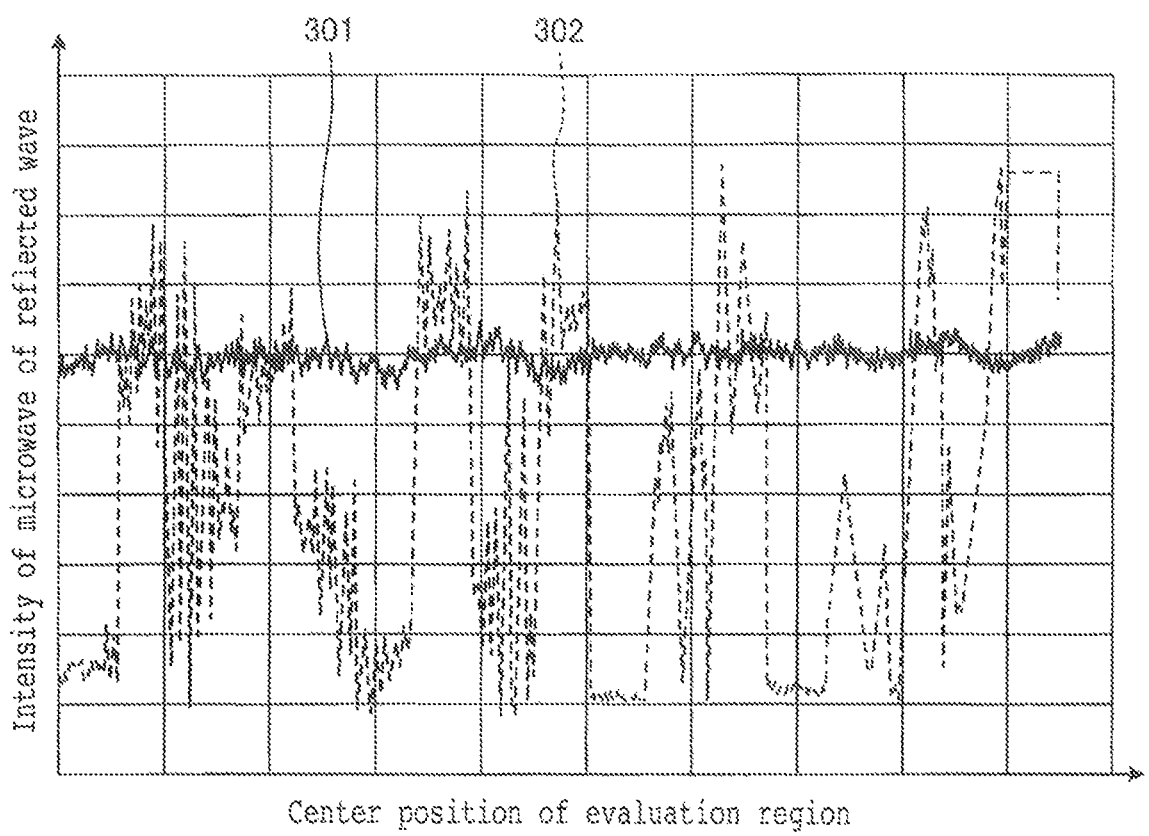
FIG. 12 is a graph depicting intensity distributions of reflected waves of microwaves received by gettering property evaluation apparatuses according to an example and a comparative example.

Next, the inventors of the present invention have confirmed the effects of the gettering property evaluation apparatus 1 according to the first embodiment. In the confirmation, variations in the intensity of the reflected wave 18 of microwave received by the transmission-reception unit 12 when the predetermined position 120 is moved along a predetermined route on the wafer 100 were detected, in an example in which the chuck table 20 having the nonmetallic porous member 21 including porous SiC was used, and a comparative example in which an existing chuck table having an existing porous member including alumina ceramic and similar in the other configuration to the gettering property evaluation apparatus 1 according to the first embodiment was used in place of the nonmetallic porous member 21. FIG. 12 illustrates graphs depicting the intensity distributions of the reflected wave of microwave received by the gettering property evaluation apparatus according to the example and the comparative example.

As represented by solid line in FIG. 12, in the example in which the chuck table 20 having the nonmetallic porous member 21 including porous SiC was used, a curve 301 in which the intensity of the reflected wave 18 of microwave is substantially constant was obtained. On the other hand, as represented by broken line in FIG. 12, in the comparative example in which the existing chuck table was used, a curve 302 in which the intensity of the reflected wave of microwave varies largely was obtained.

According to FIG. 12, while the intensity of the reflected wave of microwave varied largely according to the evaluation region in the comparative example, the intensity of the reflected wave 18 of microwave was substantially constant regardless of the predetermined position 120 in the example. In the comparative example, the microwave applied is transmitted through the existing porous member including alumina ceramic and is reflected by the bottom surface of the cavity 22-1 and the bottom surfaces of the grooves 27 as an exhaust flow path that constitute the ruggedness of the base member 22 on the lower side of the porous member. In this instance, in the comparative example, in a case where the distance between the transmission-reception unit 12 and the bottom surface of the cavity 22-1 is 16 mm and the depth of the grooves 27 as the exhaust flow path is 1 mm, the propagation distance of the microwave reflected by the bottom surfaces of the grooves 27 as the exhaust flow path increases by 2 mm as compared to the propagation distance of the microwave reflected by the bottom surface of the cavity 22-1. In the comparative example, it has been made clear, by Friis transmission formula, that in regard of the reflected wave of microwave, the received intensity (received electric power) of the microwave reflected by the bottom surfaces of the grooves 27 as an exhaust flow path was reduced by 21% as compared to the received intensity (received electric power) of the microwave reflected by the bottom surface of the cavity 22-1. On the other hand, in the example, the microwave 17 applied is reflected by the flat holding surface 24 of the nonmetallic porous member 21.

Therefore, according to FIG. 12, it has been found that in the present invention, since the chuck table 20 has the conductive nonmetallic porous member 21 constituting the holding surface 24 and having a property of reflecting or absorbing microwaves, 80% or more of a flux of the microwave 17 applied by the transmission-reception unit 12 does not reach the ruggedness of the base member 22, and, accordingly, the possibility that the intensity of the reflected wave 18 of microwave may be varied by the ruggedness of the base member 22 when the predetermined position 120 is moved can be reduced.

Note that the present invention is not limited to the above-described embodiments and modifications. In other words, the present invention can be carried out with various modifications within such ranges as not to depart from the gist of the invention. For example, in the gettering property evaluation apparatuses 1, 1-2, 1-3, 1-4, and 1-5 according to the above embodiments and modifications, gettering property of the gettering layer 110 may be evaluated based on a differential signal which is the difference in the reflected wave 18 of microwave measured at two locations of a region where the laser beam 15 is applied and a region where the laser beam is not applied, by the gettering determination unit 10. In addition, while the gettering property evaluation apparatuses 1, 1-2, 1-3, 1-4, and 1-5 according to the above embodiments and modifications evaluate gettering property of the gettering layer 110 of the wafer 100, the gettering property evaluation apparatus of the present invention is not limited to the apparatus that evaluates only the gettering property, but may be an apparatus that can measure material properties other than the gettering property of the wafer 100 and the gettering layer 110, by a micro-PCD method.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A gettering property evaluation apparatus comprising:
   a gettering determination unit that has a laser beam applying unit for applying a laser beam to a wafer, and a transmission-reception unit for applying a microwave to the wafer and receiving the microwave reflected by the wafer, and that determines whether or not a gettering layer including a grinding strain generated by grinding the wafer has a gettering property; and
   a chuck table that holds the wafer on a holding surface, wherein the chuck table has
      a conductive nonmetallic porous member constituting the holding surface and having a property of reflecting or absorbing the microwave, and
      a base member surrounding the nonmetallic porous member while exposing the holding surface and provided with a negative pressure transmission passage for transmitting a negative pressure to the nonmetallic porous member.

2. The gettering property evaluation apparatus according to claim 1,
   wherein the nonmetallic porous member includes a material having a total of reflectance of the microwave and absorbance of the microwave of equal to or more than 80%.

3. The gettering property evaluation apparatus according to claim 2,
wherein the nonmetallic porous member includes porous SiC or porous carbon.

4. The gettering property evaluation apparatus according to claim 1,
wherein the nonmetallic porous member includes porous SiC or porous carbon.

5. A gettering property evaluation apparatus comprising:
a gettering determination unit that has a laser beam applying unit for applying a laser beam to a wafer, and a transmission-reception unit for applying a microwave to the wafer and receiving the microwave reflected by the wafer, and that determines whether or not a gettering layer including a grinding strain generated by grinding the wafer has a gettering property; and
a chuck table that holds the wafer on a holding surface, wherein the chuck table has
a porous member constituting the holding surface and having a property of transmitting the microwave,
a base member provided with a negative pressure transmission passage for transmitting a negative pressure to the porous member,
a support member that is disposed on a lower side relative to the porous member to support the porous member, that is provided with a transmission passage for transmitting the negative pressure from the negative pressure transmission passage to the porous member, and that includes a material having a property of transmitting the microwave, and
a reflective plate that is disposed on a lower side relative to the support member and that has a flat surface including a conductive material reflecting the microwave.

6. The gettering property evaluation apparatus according to claim 5,
wherein the reflective plate includes one of stainless steel, iron, an iron-containing alloy, aluminum, an aluminum-containing alloy, copper, a copper-containing alloy, titanium, and carbon fiber reinforced plastic.

7. A gettering property evaluation apparatus comprising:
a gettering determination unit that has a laser beam applying unit for applying a laser beam to a wafer, and a transmission-reception unit for applying a microwave to the wafer and receiving the microwave reflected by the wafer, and that determines whether or not a gettering layer including a grinding strain generated by grinding the wafer has a gettering property; and
a chuck table that holds the wafer on a holding surface, wherein the chuck table has
a porous member constituting the holding surface and having a property of transmitting the microwave,
a base member provided with a negative pressure transmission passage for transmitting a negative pressure to the porous member,
a support member that is disposed on a lower side relative to the porous member to support the porous member, that is provided with a transmission passage for transmitting the negative pressure from the negative pressure transmission passage to the porous member, and that includes a material having a property of transmitting the microwave, and
an electromagnetic wave absorber that is disposed on a lower side relative to the support member and that includes a material absorbing the microwave.

8. The gettering property evaluation apparatus according to claim 7,
wherein the electromagnetic wave absorber includes one of a magnetic electromagnetic wave absorber, a dielectric electromagnetic wave absorber, a conductive electromagnetic wave absorber, and a $\lambda/4$ type electromagnetic wave absorber.

* * * * *